United States Patent [19]
Fang et al.

[11] Patent Number: 6,054,747
[45] Date of Patent: Apr. 25, 2000

[54] INTEGRATED PHOTORECEIVER HAVING METAL-INSULATOR-SEMICONDUCTOR SWITCH

[75] Inventors: Yean-Kuen Fang; Kuen-Hsien Wu; Kuen-Hsien Lee, all of Tainan, Taiwan

[73] Assignee: National Science Council, Taipei, Taiwan

[21] Appl. No.: 09/100,801

[22] Filed: Jun. 19, 1998

[51] Int. Cl.⁷ .................................................. H01L 31/075
[52] U.S. Cl. ............................. 257/458; 257/431; 257/53
[58] Field of Search .................................. 257/413, 458, 257/469, 448, 59, 53, 65, 72, 290, 291, 257, 258

[56] References Cited

U.S. PATENT DOCUMENTS

| | | | |
|---|---|---|---|
| 4,903,102 | 2/1990 | Yamazaki | 357/30 |
| 5,684,308 | 11/1997 | Lovejoy et al. | 257/184 |
| 5,714,772 | 2/1998 | Fang et al. | 257/82 |
| 5,736,773 | 4/1998 | Schmid | 257/437 |

FOREIGN PATENT DOCUMENTS

| | | | |
|---|---|---|---|
| 40 6-97491 | 4/1994 | Japan | 257/431 |

*Primary Examiner*—Sheila V. Clark
*Assistant Examiner*—H. D. Tran
*Attorney, Agent, or Firm*—David G. Conlin; Peter F. Corless; Dike, Bronstein, Roberts & Cushman, LLP

[57] ABSTRACT

An integrated photoreceiver is provided. The photoreceiver includes a substrate, a metal-insulator-semiconductor switch (MISS) formed on a first portion of the substrate, and a photoreceiving structure formed on a second portion of the substrate for receiving a light signal and generating a current signal to trigger the MISS in response to said light signal.

13 Claims, 7 Drawing Sheets

INTEGRATED PHOTORECEIVER HAVING METAL-INSULATOR-SEMICONDUCTOR SWITCH

FIELD OF THE INVENTION

The present invention relates to an integrated photoreceiver, and especially relates to a photoreceiver integrated by a PIN photodiode and a metal-insulator-semiconductor switch (MISS).

BACKGROUND OF THE INVENTION

A photoreceiver is usually used for a high sensitive optical fiber communication system or the device where a high output is needed to drive some electronic load circuit. In the past, most of the photoreceivers are prepared based on III–V compound material. These photoreceivers can be operated in low voltage and high wavelength, and are advantaged in having high photo absorption coefficients.

However, a conventional photoreceiver is constructed by a combination of a PIN photodiode and a filed effect transistor (FET), or a modulation doped FET (MODFET). Such a structure needs complex processes such as the molecular beam epitaxy and the liquid phase epitaxy (LPE), etc. Furthermore, the temperature for manufacturing the PIN element is so high that it will change the characteristic of the FET element, which serves as an amplifier. Manufacturing the FET element is too expensive to be applied on a large area optoelectronic integrated circuit (OEIC). Furthermore, the output current of the FET or MOFET is very low. Accordingly, if the current is used to drive the external load device, a further amplifier stage is necessary which will increase the cost and lower the system speed.

Moreover, the insulating layers of the conventional MISS structure are formed by high-temperature processes, and can be silicon oxide (formed at 1000–1100° C.), silicon nitride (formed at 700–900° C.) or polysilicon (formed at 700–900° C.). The high temperature will influence the characteristic of the semiconductor under the insulating layer. The other devices formed before the formation of insulating layer may also be damaged by the high manufacturing temperature.

It is therefore attempted by the Applicant to solve the above-mentioned problems.

SUMMARY OF THE INVENTION

An object of the present invention is to provide a photoreceiver having high sensitivity in photoreceiving and high output current.

The other object of the present invention is to provide a photoreceiver capable of being manufactured into large area in low cost.

Another object of the present invention is to provide a method for manufacturing a photoreceiver, wherein the semiconductor and the device formed with the integrated circuit of the photoreceiver will not be damaged or influenced in characteristics.

According to the present invention, a photoreceiver is provided. The photoreceiver includes: a substrate, a metal-insulator-semiconductor switch (MISS) formed on a first portion of the substrate, and a photoreceiving structure formed on a second portion of the substrate for receiving a light signal and generating a current signal to trigger the MISS in response to said light signal.

The substrate is preferably a silicon substrate, and the MISS has a semiconductor layer provided by the silicon substrate, an insulating layer formed above the silicon substrate, and a metal layer formed above the insulating layer. The metal layer is preferably a gold layer.

The insulator layer is preferably an intrinsic amorphous silicon layer. The silicon substrate preferably has a p-type crystal-silicon layer and an n-type crystal-silicon layer formed below the p-type crystal-silicon layer.

The photoreceiver preferably further including an electrode layer formed below the silicon substrate. The electrode layer is preferably a gold layer.

The photoreceiving structure is preferably a photodiode.

The photodiode preferably has a p-type amrphous silicon layer formed above the silicon substrate, an intrinsic amorphous $Si_{1-x}Ge_x$ layer formed above the p-type amorphous silicon layer, and an n-type amorphous silicon layer formed above the intrinsic amorphous $Si_{1-x}Ge_x$ layer.

The photodiode preferably further includes a transparent electrode layer formed above the n-type amorphous silicon layer. The transparent electrode layer is preferably an indium-tin oxide (ITO) layer.

the present invention further provides a method for manufacturing the above-mentioned photoreceiver. The method includes steps of preparing a semiconductor substrate served as the substrate, forming an insulating layer over the semiconductor substrate, forming a first metal layer over the insulating layer, patterning and etching the first metal layer and the insulating layer to form the metal-insulator-semiconductor switch (MISS) on the first portion of the substrate, and forming the photoreceiving structure on the second portion of the substrate.

The insulating layer is preferably an intrinsic-amorphous-silicon layer formed by a plasma-enhanced chemical vapor deposition (PECVD) at a temperature below 250° C.

When the first metal layer is formed, it is preferably to form a second metal layer under the semiconductor substrate.

The photoreceiving structure is preferably a photodiode structure. The steps for forming the photodiode structure may be described as follows forming a p-type amorphous silicon layer over the semiconductor substrate, forming an intrinsic amorphous $Si_{1-x}Ge_x$ layer over the p-type amorphous silicon layer, forming an n-type amorphous silicon layer over the amorphous $Si_{1-x}Ge_x$ layer, forming a transparent electrode layer above the n-type amorphous silicon layer, and patterning and etching the transparent electrode layer, the n-type amorphous silicon layer, the amorphous $Si_{1-x}Ge_x$ layer and the p-type amorphous silicon layer to form the photodiode structure. These steps are preferably executed by PECVD.

The present invention may best be understood through the following description with reference to the accompanying drawings, in which

DETAILED DESCRIPTION OF THE PREFERRED EMBODIMENTS

Figure 1:
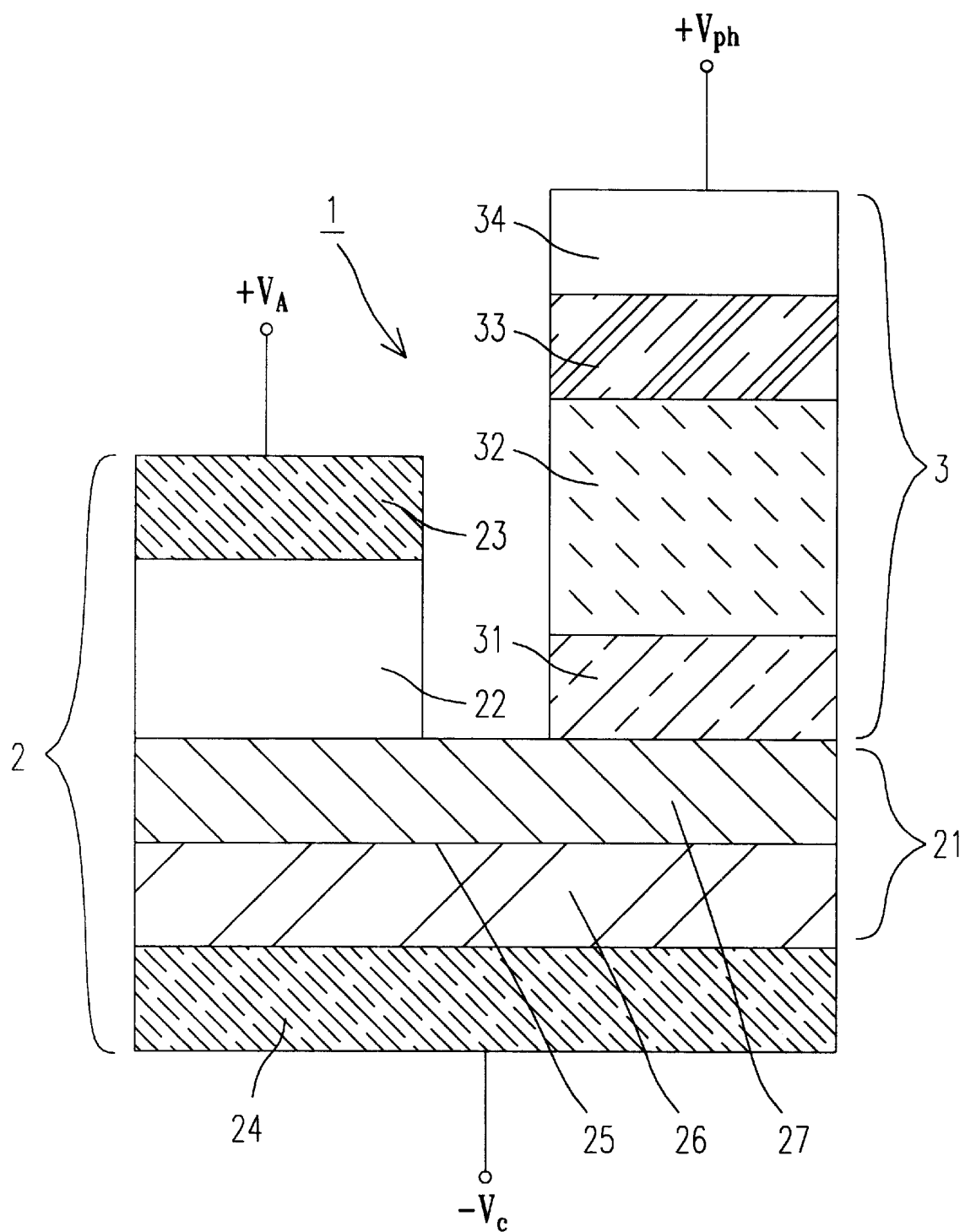
FIG. 1 is an illustration of a structure of a preferred embodiment of the PIN/MISS photoreceiver of the present invention.

Referring to FIG. 1 which illustrates a preferred embodiment of a PIN/MISS photoreceiver 1. The photoreceiver 1 is integrated by the MISS device 2 and the PIN photodiode 3. The MISS device 2 includes the crystal-silicon substrate 21 and the intrinsic amorphous silicon (i-a-Si:H) layer 22. The MISS device 2 further includes gold layers 23 and 24, respectively formed above the intrinsic amorphous silicon layer 22 and under the crystal-silicon substrate 21. The gold layers 23 and 24 serve as the electrode layers. The crystal-silicon substrate 21 includes a p-type layer 27 and an n-type layer 26, which form a P/N junction 25 therebetween. The PIN photodiode includes a p-type amorphous silicon (p-a-Si:H) layer 31 formed above the crystal-silicon substrate 21, an intrinsic amorphous $Si_{1-x}Ge_x$ (i-a- $Si_{1-x}Ge_x$:H) layer 32, an n-type amorphous silicon layer (n-a-Si:H) 33, and an indium-tin oxide (ITO) layer 34. The thickness of the i-a-Si:H layer 22, the p-a-Si:H layer 31, the i-a- $Si_{1-x}Ge_x$:H layer 32 and the n-a-Si:H 33 are 300–2500 Å, 375 Å, 6000–7500 Å and 500 Å, respectively. The Au electrode layers 23, 24, and the ITO layers 34 respectively have a thickness of 5000 Å, 5000 Å and 1000 Å.

The PIN/MISS photoreceiver 1 may be manufactured by the following procedures:

(a) Preparing a preformed p-c-Si/n-c-Si wafer serving as the substrate 21.

(b) Growing the i-a-Si:H layer 22 having a thickness of 300–2500 Å by plasma-Enhanced chemical vapor deposition (PECVD), wherein the substrate temperature, the pressure and the RF power for growing the i-a-Si:H layer 22 are respectively 250° C., 1 Torr and 50 Watt. The growing gas is $SiH_2$(25% in $H_2$). The thickness of the growing layer is controlled by the deposition rate. The deposition rate for growing the i-a-Si:H layer is 60 Å/mm.

(c) Evaporating an Au layer 23 with a thickness of 5000 Å over the i-a-Si:H layer 22 in an evaporator, wherein the Au layer 23 serves as the anode electrode for being applied thereon the anode bias of the MISS device $2(+V_A)$.

(d) Transferring a pattern of the MISS device 2 to the surface of the Au layer 23 by a photolithographic process and then etching the Au layer 23 and the i-a-Si:H layer 22 according to the pattern, wherein the effective area of the MISS device 2 is about 1 mm².

(e) Evaporating an Au layer 24 with a thickness of 5000 Å over the other side of the substrate 21, wherein the Au layer 24 serves as the cathode electrode for being applied thereon the cathode bias of the MISS device $2(-V_C)$.

(f) Growing the p-a-Si:H layer 31(375 Å), i-a-$Si_{1-x}Ge_x$ layer 32(6000–7500 Å) and the n-a-Si:H layer 33(500 Å) in sequence above the p-c-Si layer 27 by PECVD. The substrate temperature, the pressure, the RF power, and the growing gas are respectively (1) 250° C., 1 Torr, 50 Watt and $SiH_4$(25% in $H_2$)+$B_2H_6$(500 ppm in $H_2$) for growing the p-a-Si:H layer; (2) 250° C., 0.5 Torr, 40 Watt and $SiH_4$+$GeH_4$(47.8% in $H_2$) for growing the i-a-$Si_{1-x}Ge_x$ layer, (3) 250° C., 1 Torr, 50 Watt and $SiH_4$+$PH_3$(1% in $H_2$) for growing the n-a-Si:H layer. The thicknesses of these deposition layers are respectively controlled by their own deposition rates. The deposition rates for p-a-Si:H layer, n-a-Si:H layer and the i-a-$Si_{1-x}$(ie. layer are 60 Å/min, 60 Å/min and 200 Å/min respectively.

(g) Coating the transparent electrode layer 34 (5000 Å) on the n-a-Si:H layer 33. The transparent electrode layer 33 is an Indium Tin oxide layer for applying thereon the working bias ($1V_{PH}$) of the PIN photodiode.

(h) Executing photolithography and etching processes to form the PIN photodiode 3. The effective area of the PIN photodiode is about 3.19 mm².

Figure 2A:
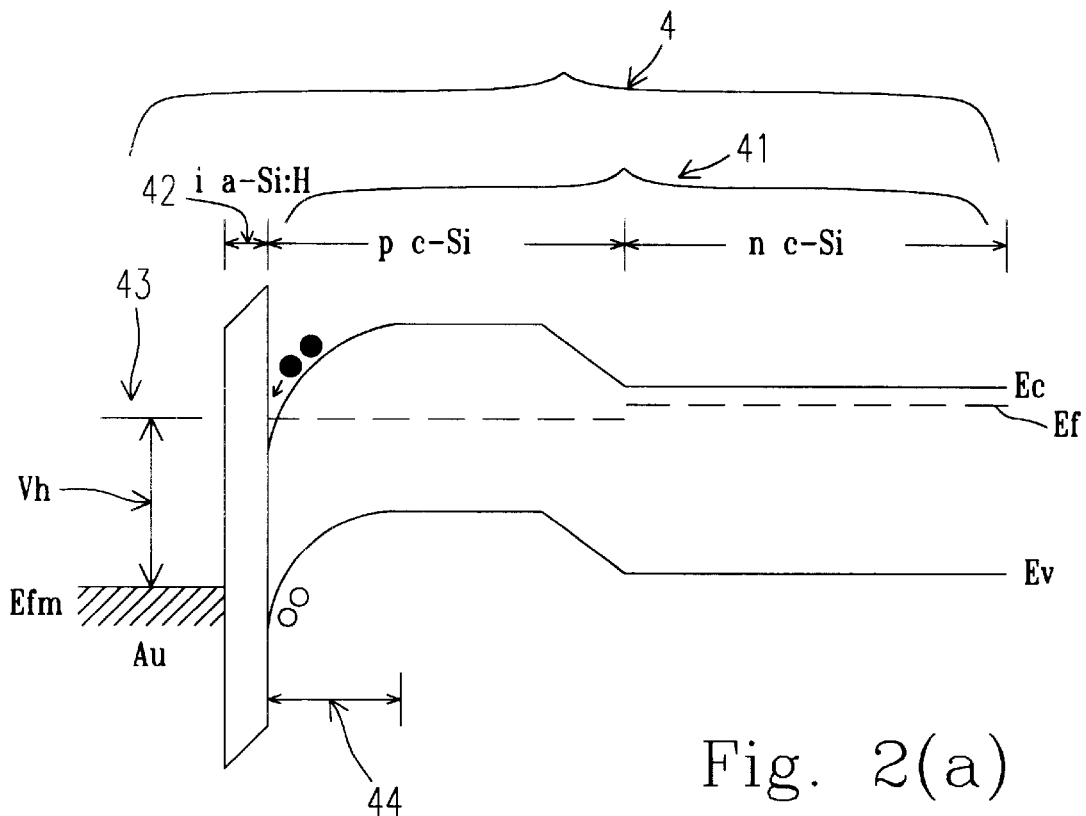
FIG. 2(a) is an energy-band diagram of a MISS device according to the present invention, wherein a switching situation is happened.
Figure 2B:
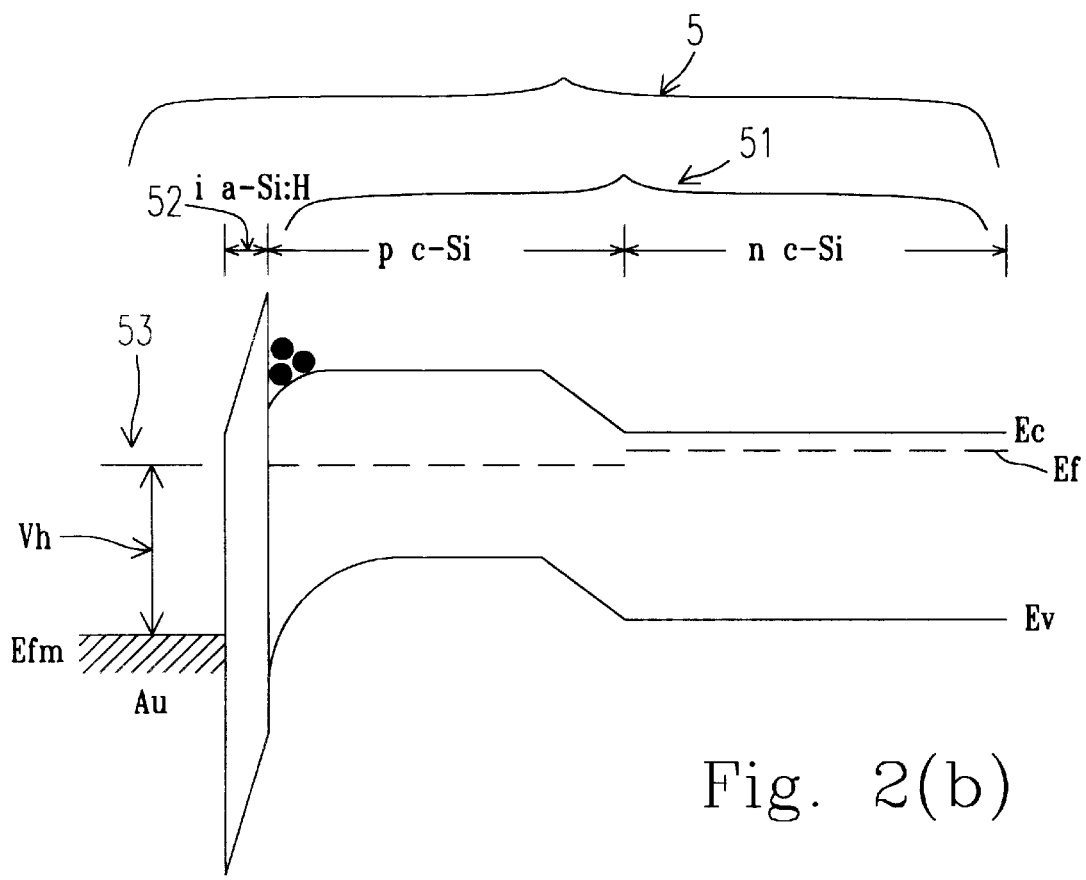
FIG. 2(b) is an energy-band diagram of a MISS device according to the present invention, wherein the MISS device is switched to an "on" state.

Please refer to FIGS. 2(a) and 2(b) which are energy-band diagrams of the MISS device as shown in FIG. 1. In FIG. 2(a), The MIS region 4 of the energy band diagram includes a semiconductor region 41, an insulator region 42 and a metal region 43. The region 4 further includes a depletion region 44 in the portion of the semiconductor region 41 adjacent to the junction between the insulator region 42 and the semiconductor region 41. The Fermi-level of the metal (Au) $E_{tm}$, the lowest boundary level of the silicon semiconductor's conducting band $E_C$, the quasi-Fermi-level of the semiconductor $E_1$, and the highest boundary level of the silicon semiconductor's value band $E_V$ are also indicated in FIG. 2(a).

As shown in FIG. 2(b), the MIS region 5 includes a semiconductor region 51, an insulator region 52 and a metal layer 53. The holding voltage $V_h$, the Fermi-level of metal (Au) $E_{tm}$, the lowest boundary level of the silicon semiconductor's conducting band $E_C$, the semiconductor's quasi-Fermi-level $E_1$ and $E_V$, the highest boundary level of the semiconductor's value band are also indicated in FIG. 2(b).

A photodiode and a MISS device are grown on a crystal-silicon substrate having a P/N junction to form the PIN/MISS photoreceiver as shown in FIG. 1. When a positive voltage is applied on the anode of the MISS device, as shown in FIG. 2(a), most part of the bias voltage is applied on the MIS (metal insulator semiconductor) region. Only a small part of the bias voltage is applied on the P/N junction of the crystal-silicon substrate. If the positive bias voltage is increased, the depletion region of the p-c-Si layer under the anode will be expanded. Meanwhile, the electron-hole pairs generated in the depletion region will form the leakage current. If the external bias is continuously increased, the extra electrons will be injected from the n-type crystal-silicon layer 26 into the p-c-Si layer 27 and the i-a-Si layer 22. If the intensity of this electron current is limited to keep the electrons from penetrating the MISS device, the electrons will be accumulated on the junction of the p-c-Si layer 27 and the i-a- Si layer 22. This accumulation will increase the bias applied on the i-a-Si layer 22. When a certain number of electrons are accumulated, an inversion layer will be built. Accordingly, the electric field applied on the insulator layer 22 is increased, and thus the penetrating current is increased. The increased current is then forcedly fed back to the P/N junction, and thus reduces the resistance of the MISS device. Therefore, a positive feedback process is occurred and the MISS device is switched from an "off" state having high resistance into an "on" state having low resistance.

If there is a positive current injected into the p-c-Si layer, the barrier height of the P/N junction will be reduced. If the number of the injected carriers is further increased, the intensity of the current will be kept on increased. An accumulation breakdown of the device will happen if a relatively small external bias is applied. When a light is illuminated on the absorbing layer (i-a-$Si_{1-x}Ge_x$) of the PIN photodiode, a photocurrent will be occurred. The photocurrent is injected into the p-c-Si layer and thus causes the MISS device to be switched from the "off" state to the "on" state, and a relatively large output current will be occurred.

Figure 3:
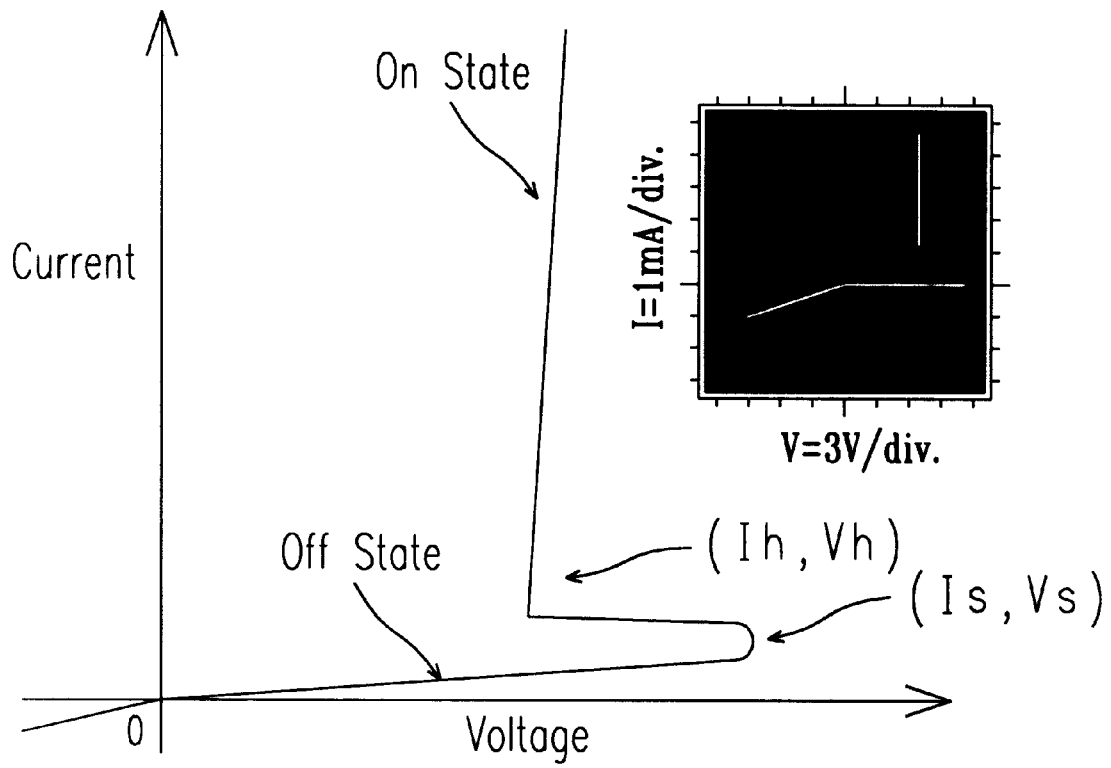
FIG. 3 is a typical Current/Voltage curve of a MISS device according to the present invention.

FIG. 3 illustrates a typical current/voltage (I/V) characteristic diagram of the MISS device according to the present invention. When the external bias is less than the switch voltage $V_s$, the MISS device is operated under a relatively high voltage and a relatively low current, that is, an "off" state. If a triggering current is injected into the p-c-Si layer, the MISS device will be switched to an "on" state and has a relatively low voltage and a relatively high current. The value of the voltage will be maintained at the hold voltage $V_h$. When the operation voltage of the MISS device is switched from the high voltage to the relatively low voltage $V_h$, the voltage difference ($V_s-V_h$) will be applied on the load device. Then, a high-intensity current will be output to the load device. In FIG. 3, $V_s$=8.4V, $V_h$=5.2V, and $1_s$–40 nA.

Figure 4:
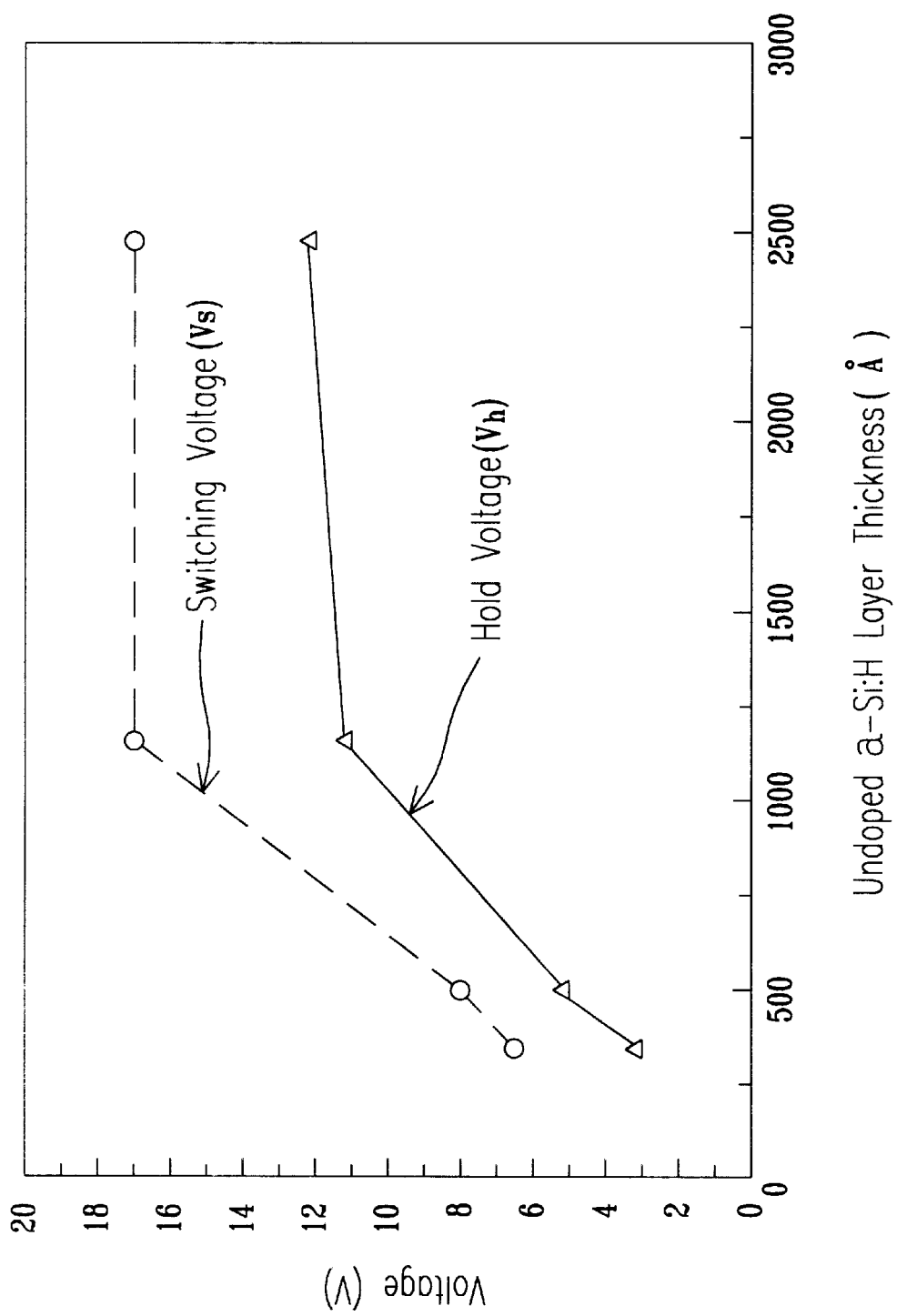
FIG. 4 illustrates the influence of the thickness of the i-a-Si:H layer on the switching voltage $V_s$ and the hold voltage $V_h$.

FIG. 4 indicates influences of the thickness of the i-a-Si:H layer on the switching voltage $V_s$ and the hold voltage $V_h$ of the MISS device. It is observed that the values of the switching voltage $V_s$ and the hold voltage $V_h$ are increased when the thickness of the i-a-Si:H layer is increased. The reason is that because the thickness of the i-a-Si:H layer determines the penetrating distance of the carriers, and the distance will influence the probability of penetration. In FIG. 4, it is indicated that the difference of $V_s$ and $V_h$ is 3.2V when the thickness of the i-a-Si:H layer is 500 Å. Accordingly, when the load resistance is 1KΩ, the output current of the MISS device will be 3.2 mA which is capable of driving the external load device such as a light emitting diode(LED) or a relay.

Figure 5:
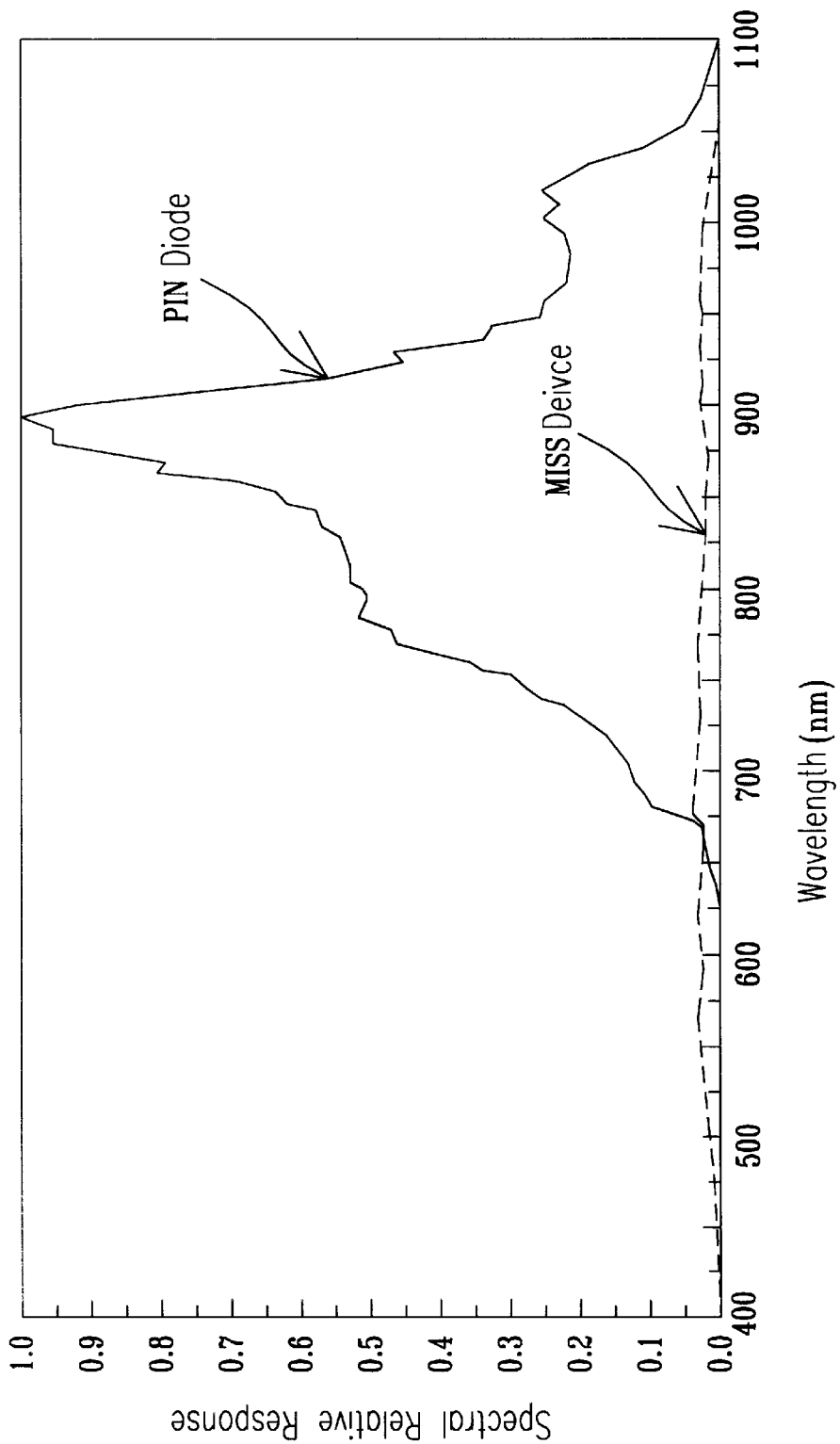
FIG. 5 is a diagram of the spectral relative responses of the PIN photodiode and the MISS device according to the present invention, wherein both the PIN photodiode and the MISS device respectively include an i-a-Si:H layer having a thickness of 75000 Å.

FIG. 5 illustrates a spectral relative response diagram of the PIN diode and the MISS device according to the present invention. The i-a-$Si_{1-x}Ge_x$ layer of the PIN diode as shown in FIG. 5 has a thickness of 7500 Å, and x=0.48. It is observed that the peak of the PIN diode has a response wavelength of about 905 nm. On the other hand, the diagram of the MISS device is almost a wide-band response. That is to say, the spectral relative response of the MISS device doesn't have any wavelength selectivity. Accordingly, the integration of the PIN diode and the MISS device forms a photoreceiver having the light wavelength selectivity and high current driving ability.

Figure 6:
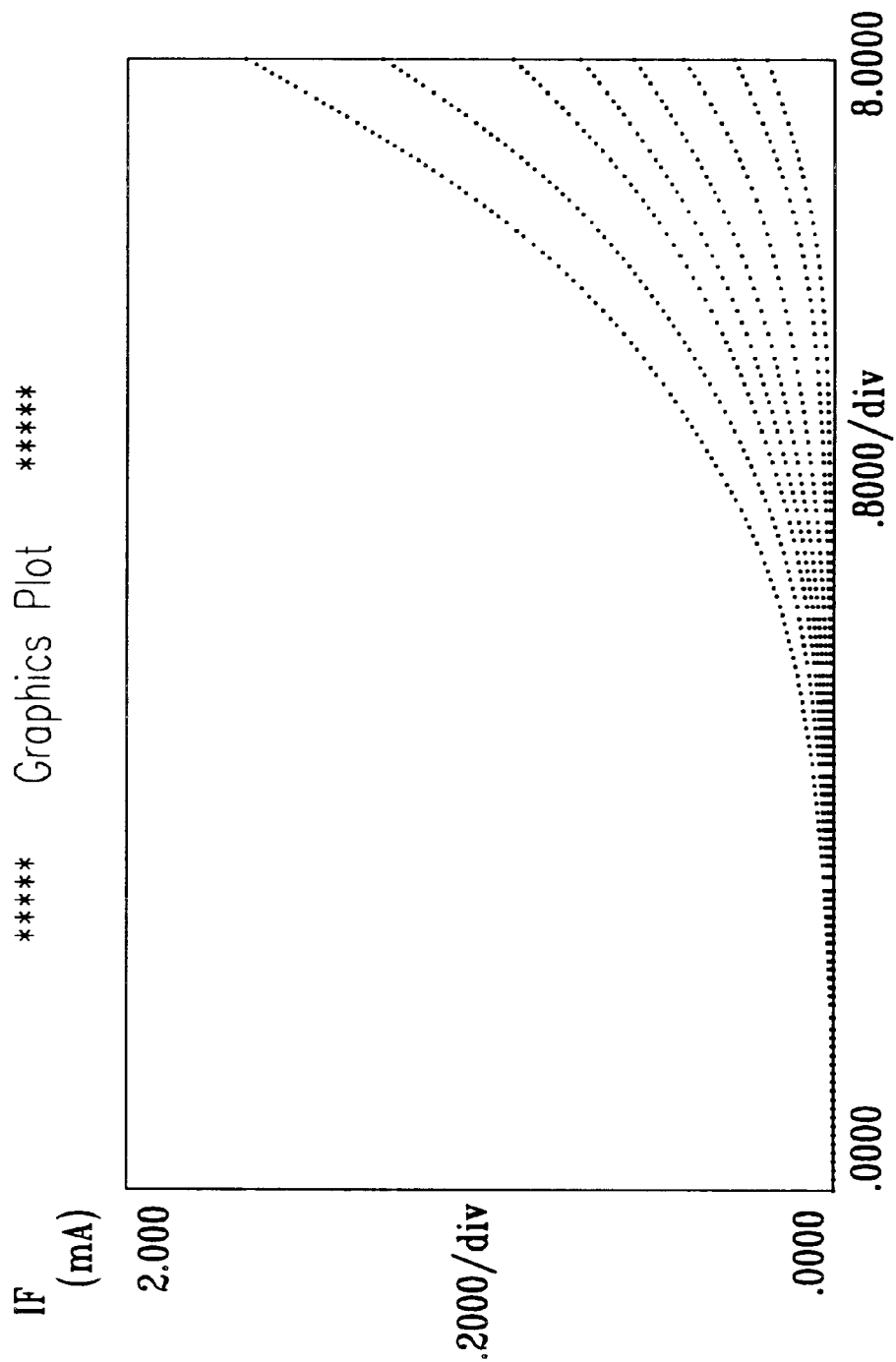
FIG. 6 is a current/voltage characteristic diagram of a PIN photodiode according to the present invention in response to incident lights having different powers.

FIG. 6 indicates the influence of the power of the incident light on the current/voltage characteristic diagram. An incident light having a wavelength of 910 nm and an intensity of 5 m/w is provided by a laser diode. When the incident light has a power of 20 µW and the reverse bias voltage is 6V, the PIN photodiode will generate a photocurrent having an intensity of 250 µA. Such a photocurrent has intensity enough to trigger the MISS device and switch it from the "off" state to the "on" state. In other words, the PIN/MISS photoreceiver is capable of detecting an incident light having small power and generating a relatively large output current to drive the load device.

Figure 7:
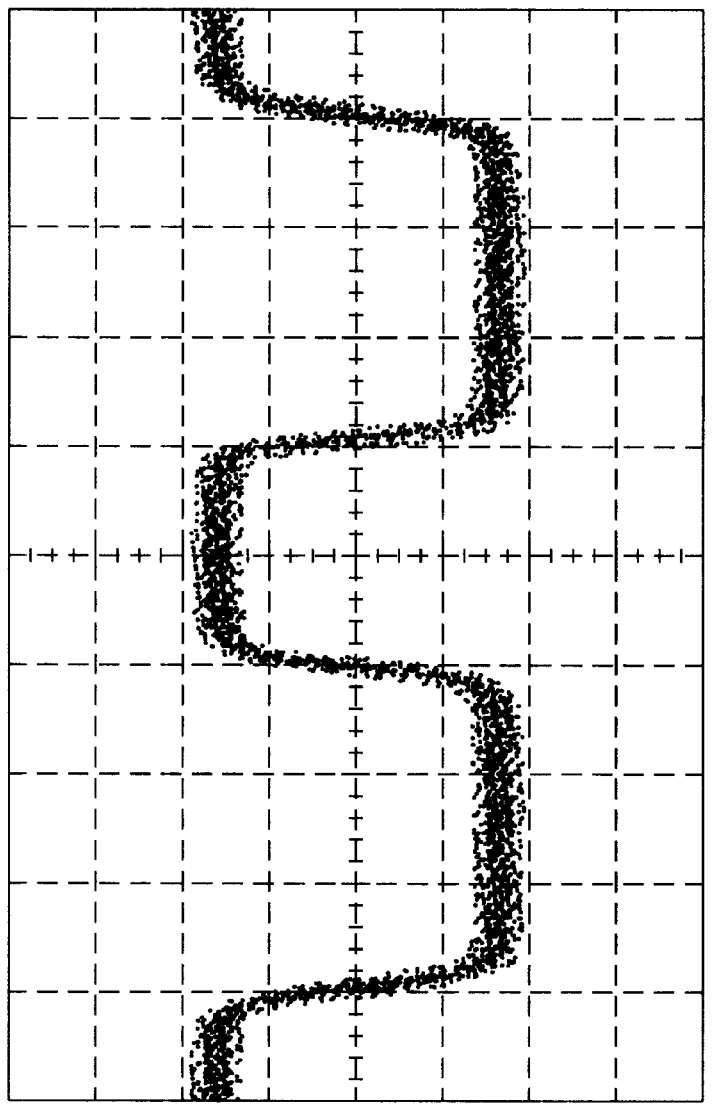
FIG. 7 shows an optical response rate diagram of a PIN/MISS photoreceiver according to the present invention.

FIG. 7 indicates the response rate diagram of the PIN/MISS photoreceiver according to the present invention. The source of the incident light is a light emitting diode (LED) which emits light having a wavelength of 820 nm and an average intensity of 100 µW. The photoreceiver is serially connected to a load device having a resistance of 1KΩ. It is observed in FIG. 7 that, when the reverse bias voltage applied on the photoreceiver is 6V, the rise time and the fall time respectively are 465 µs and 375 µs.

The advantages of the PIN/MISS integrated photoreceiver of the present invention can be summarized as follows:

1. A MISS device serving as the output stage of a photoreceiver is characterized by its high speed and high current driving ability. The FET or MODFET of the conventional photoreceiver is replaced by the MISS device. Accordingly, the photoreceiver of the present invention is advantaged in the increased operation speed and the ability of directly driving the external load device such as an LED or a relay. Therefore, the followed amplifier system can be omitted, and thus the area of elements is reduced and the operation speed of the entire system is increased.

2. The insulator layer of a conventional MISS device must be prepared at a high temperature. In the present invention, the materials for forming the insulator, such as the silicon dioxide (manufactured at 1000–1100° C.), silicon nitride (manufactured at 700–900° C.) or polysilicon (700–900° C.), are replaced by amorphous silicon material made by PECVD which is performed at a low temperature (less than 250° C.). The low manufacturing temperature of the insulating layer ensures that the original characteristic of the P/N semiconductor under the insulator layer will not be influenced by the formation of the insulating layer.

3. The PIN photodiode of the present invention is also manufactured by PECVD, a low-temperature process, such that the original characteristics of the pre-formed MISS device will not be changed.

4. The photoreceiver of the present invention can be manufactured in a simple and low cost manner. The amorphous silicon and amorphous silicon-germanium alloy are low-cost materials that can be applied on a large-area device. Furthermore, the devices of the present invention are formed by PECVD that is a low-temperature process. Accordingly, the characteristic of the formed devices will not be changed by the proceeding process.

5. The substrate used in the photoreceiver of the present invention is made of silicon. The basic materials of the other portions of the photoreceiver are also made of/from silicon. Therefore, the manufacturing process of the present invention's photoreceiver is compatible with the very large scaled integration (VLSI) technology and thus can be applied on the development of an application specific integrated circuit (ASIC). The photoreceiver of the present invention can also be made as an array optoelectronic IC for being applied in a large-area optoelectronic system.

6. The photoabsorption layer of the PIN photoreceiver is made of amorphous Si-Ge alloy, i-a-$Si_{1-x}Ge_x$, which has a high photoabsorption coefficient. The photoreceiver can absorb light in different wavelengths by adjusting the composition ratio of silicon and Gallium in the amorphous Si-Ge alloy, i.e, by changing the x value of i-a $Si_{1-x}Ge_x$. Thus, by changing the x value, the device of the present invention can be manufactured as a photoreceiver of a specific light source that emits ultra-violet (UV) light, red light or infra-red (IR) light.

To sum up, the conventional photoreceiver is constructed by a combination of a PIN photodiode and a filed effect transistor (FET). The conventional structure has defects on complex manufacturing processes and high manufacturing temperature that will change the characteristic of the FET element that serves as an amplifier. Manufacturing the FET element is too expensive to be applied on a large-area optoelectronic integrated circuit. Furthermore, the output current of the photoreceiver made by III–V compound material is very low. Accordingly, if the current is used to drive the external load device, a further stage of an amplifier is necessary resulting in increasing the cost and lowering the system operation speed. The PIN/MISS structure of the present invention combines a high sensitive PIN photodiode was a MISS having a high output current, so it is advantaged in having low noise and high current driving ability. Furthermore, the material of the photoreceiver according to the present invention includes amorphous Si and amorphous Si-Ge alloy that have high photo-absorbing coefficient, low cost and the ability of being manufactured as a large-area device. Moreover, the low growing temperature of PECVD will keep the pre-formed devices from being damaged. When the power of the incident light is $100 \mu W$ and the load resistance is $1 K\Omega$, the photoreceiver can provide a very high output current of about 3.2 mA under a reverse has of 6V, and the rise time is $465 \mu s$. It is proved that the photoreceiver can be applied on the optoelectronic system very well.

While the invention has been described in terms of what are presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A photoreceiver, comprising:
    a substrate,
    a metal-insulator-semiconductor switch (MISS) formed on a first portion of said substrate; and
    a photoreceiving structure formed on a second portion of said substrate for receiving a light signal and generating a current signal in response to said light signal for switching said MISS from a high resistivity state to a low resistivity state.

2. A photoreceiver according to claim 1 wherein said substrate is a silicon substrate, and said MISS has a semiconductor layer provided by said silicon substrate, an insulating layer formed above said silicon substrate, and a metal layer formed above said insulating layer.

3. A photoreceiver according to claim 2 wherein said metal layer is a gold layer.

4. A photoreceiver according to claim 2 wherein said insulator layer is an intrinsic amorphous silicon layer.

5. A photoreceiver according to claim 2 wherein said silicon substrate has a p-type crystal-silicon layer and an n-type crystal-silicon layer formed below said p-type crystal-silicon layer.

6. A photoreceiver according to claim 2, further including an electrode layer formed below said silicon substrate.

7. A photoreceiver according to claim 6 wherein said electrode layer is a gold layer.

8. A photoreceiver according to claim 1 wherein said photoreceiving structure is a photodiode.

9. A photoreceiver according to claim 8 wherein said photodiode has a p-typeamrphous silicon layer formed above said silicon substrate, an intrinsic amorphous $Si_{1-x}Ge_x$ layer formed above said p-type amorphous silicon layer, and an n-type amorphous silicon layer formed above said intrinsic amorphous $Si_{1-x}Ge_x$ layer.

10. A photoreceiver according to claim 9 wherein said photodiode further includes a transparent electrode layer formed above said n-type amorphous silicon layer.

11. A photoreceiver according to claim 10 wherein said transparent electrode layer is an indium-tin oxide layer.

12. A photoreceiver, comprising:
    a metal-insulator-semiconductor switch (MISS) formed by a substrate, an insulator layer formed above a first portion of said substrate, and a metal layer formed above said insulator layer; and
    a pin diode integrally formed above a second portion of said substrate.

13. A photoreceiver, comprising:
    a light-receiving device having a light-absorbing layer made of a $Si_{1-x}Ge_x$:H; and
    a metal-insulator-semiconductor switch (MISS) integrally formed with said light-receiving device.

* * * * *